United States Patent
Yeh et al.

(10) Patent No.: US 9,214,754 B2
(45) Date of Patent: Dec. 15, 2015

(54) HOLDING DEVICE USED FOR ELECTRICAL CONNECTOR

(71) Applicant: HON HAI PRECISION INDUSTRY CO., LTD., New Taipei (TW)

(72) Inventors: Cheng-Chi Yeh, New Taipei (TW); Chih-Kai Yang, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 33 days.

(21) Appl. No.: 14/161,630

(22) Filed: Jan. 22, 2014

(65) Prior Publication Data

US 2014/0329404 A1    Nov. 6, 2014

(30) Foreign Application Priority Data

May 3, 2013    (TW) .............................. 102115866 A

(51) Int. Cl.
| | | |
|---|---|---|
| H01R 13/62 | (2006.01) | |
| H01R 13/516 | (2006.01) | |
| H05K 7/10 | (2006.01) | |

(52) U.S. Cl.
CPC ............ *H01R 13/516* (2013.01); *H05K 7/1053* (2013.01)

(58) Field of Classification Search
CPC . H05K 7/1053; H05K 7/1061; H05K 7/1007; H05K 7/1023; G06K 7/0021; H01R 13/62933; H01R 13/639; H01R 13/6275; H01R 13/6395; H01R 13/62938; H01R 23/7005; H01R 23/7068; H01R 23/684
USPC .......................................... 439/331, 326, 372
See application file for complete search history.

(56) References Cited

U.S. PATENT DOCUMENTS

| | | | | | |
|---|---|---|---|---|---|
| 3,942,854 | A | * | 3/1976 | Klein et al. .................... | 439/331 |
| 4,456,318 | A | * | 6/1984 | Shibata et al. .................. | 439/68 |
| 4,601,525 | A | * | 7/1986 | Kandybowski ............... | 439/329 |
| 4,621,884 | A | * | 11/1986 | Berkebile et al. ............. | 439/367 |
| 4,692,790 | A | * | 9/1987 | Oyamada ....................... | 257/727 |
| 6,383,027 | B2 | * | 5/2002 | Cabane et al. ................ | 439/630 |
| 6,485,320 | B1 | * | 11/2002 | Ma ................................ | 439/342 |
| 6,527,577 | B1 | * | 3/2003 | Chen et al. .................... | 439/342 |
| 6,648,656 | B1 | * | 11/2003 | Ma ................................ | 439/73 |
| 6,722,909 | B1 | * | 4/2004 | McHugh et al. .............. | 439/331 |
| 6,776,642 | B1 | * | 8/2004 | McHugh et al. .............. | 439/331 |
| 6,799,978 | B2 | * | 10/2004 | Ma et al. ......................... | 439/73 |
| 6,869,303 | B1 | * | 3/2005 | Ma ................................ | 439/331 |
| 6,875,038 | B1 | * | 4/2005 | McHugh et al. .............. | 439/331 |
| 6,932,622 | B2 | * | 8/2005 | Liao et al. ....................... | 439/73 |

(Continued)

FOREIGN PATENT DOCUMENTS

| | | |
|---|---|---|
| CN | 2909626 | 6/2007 |
| CN | 201937122 | 8/2011 |

(Continued)

*Primary Examiner* — Abdullah Riyami
*Assistant Examiner* — Vladimir Imas
(74) *Attorney, Agent, or Firm* — Wei Te Chung; Ming Chieh Chang

(57) ABSTRACT

A holding device for an electrical connector, includes a frame with an opening defined on a center thereof. A first locking portion is disposed on the frame and extends into the opening. A second locking portion has a main body with an elastic arm. The main body defines a fixed end fixed to the frame and an active end rotating around the fixed end. The second locking portion has an open position that the active end can move freely and a closed position that the active end locks to the frame while the elastic arm extends into the opening.

19 Claims, 5 Drawing Sheets

(56) References Cited

U.S. PATENT DOCUMENTS

| | | | |
|---|---|---|---|
| 6,957,973 B1* | 10/2005 | McHugh et al. | 439/331 |
| 7,097,517 B2* | 8/2006 | Ma | 439/733.1 |
| 7,112,068 B2* | 9/2006 | Ma | 439/71 |
| 7,182,620 B1* | 2/2007 | Ju | 439/331 |
| 7,265,990 B2* | 9/2007 | Wang et al. | 361/740 |
| 7,297,010 B2* | 11/2007 | Tsai | 439/331 |
| 7,338,308 B2* | 3/2008 | Nakao et al. | 439/331 |
| 7,422,461 B2* | 9/2008 | Chen | 439/326 |
| 7,470,128 B2* | 12/2008 | Ju | 439/73 |
| 7,497,717 B2* | 3/2009 | Zhang | 439/331 |
| 7,682,178 B2* | 3/2010 | Feng | 439/326 |
| 7,708,580 B2* | 5/2010 | Yeh | 439/331 |
| 7,828,577 B2* | 11/2010 | Yeh | 439/331 |
| 7,867,006 B2* | 1/2011 | Yeh | 439/331 |
| 8,052,451 B2* | 11/2011 | Yeh | 439/331 |
| 8,092,242 B2* | 1/2012 | Yeh | 439/331 |
| 8,123,543 B1* | 2/2012 | Terhune, IV | 439/331 |
| 8,172,597 B1* | 5/2012 | Terhune, IV | 439/331 |
| 8,251,714 B2* | 8/2012 | Yeh | 439/73 |
| 8,439,693 B2* | 5/2013 | Yeh et al. | 439/135 |
| 8,460,012 B2* | 6/2013 | Zhou et al. | 439/73 |
| 8,506,316 B2* | 8/2013 | Tsai et al. | 439/331 |
| 8,587,947 B2* | 11/2013 | Yonemochi | 361/719 |
| 8,834,191 B2* | 9/2014 | Yeh et al. | 439/331 |
| 8,979,565 B2* | 3/2015 | Yeh | 439/331 |
| 8,979,566 B2* | 3/2015 | Yeh | 439/331 |
| 2009/0176397 A1* | 7/2009 | Yeh et al. | 439/331 |
| 2011/0294330 A1 | 12/2011 | Dai | |
| 2012/0156919 A1* | 6/2012 | Yeh et al. | 439/370 |

FOREIGN PATENT DOCUMENTS

| | | |
|---|---|---|
| CN | 202178462 | 3/2012 |
| CN | 202601972 | 12/2012 |
| CN | 202633656 | 12/2012 |
| TW | M429214 U | 5/2012 |

* cited by examiner

FIG. 3 is a perspective view of a holding device;

FIG. 4 is similar to FIG. 2, and more particularly to an exposed view of the holding device; and FIG. 5 is an assembled view of the holding device assembly mounted to an electrical connector

HOLDING DEVICE USED FOR ELECTRICAL CONNECTOR

BACKGROUND OF THE INVENTION

1. Field of the Invention

The present invention relates to a holding device, and more particularly to a holding device with a central package unit (CPU) assembled to an electrical connector. This application relates to a copending application Ser. No. 13/846,910 filed on Mar. 18, 2013, and another application titled "CARRIER AND CARRIER ASSEMBLY USED THEREOF FOR POSITIONING IC PACKAGE" and having the same inventors and the same assignee with the instant invention.

2. Description of Related Art

Chinese Pat. No. 202178462 issued to Cai et al. on Mar. 28, 2012 discloses electrical connector with a holding device for holding a CPU. The electrical connector includes a lower plate, an insulative housing disposed in the middle of the lower plate, two levers pivotally mounted on two opposite ends of the lower plate, and an upper plate mounted on one of the lever. The holding device loading the CPU is assembled to the upper plate and rotates with regard to the insulative housing. The holding device has a plurality of spring arms extending into corresponding cutouts defined on the CPU for preliminary location the CPU, and then use some adhesive to bond the holding device and the CPU.

However, the adhesive may be difficult to clean out if there need to detach the CPU from the holding device. Furthermore, the adhesive residue may bring other problem in subsequent operation process.

Therefore, an improved holding device is needed.

SUMMARY OF THE INVENTION

An object of the present invention is to provide a holding device which load a CPU adapt to assemble to an electrical connector.

According to one aspect of the present invention, a holding device used for an electrical connector, comprises a frame with an opening defined on a center thereof. A first locking portion is disposed on the frame and extends into the opening. A second locking portion has a main body with an elastic arm. The main body defines a fixed end fixed to the frame and an active end rotating around the fixed end. The second locking portion has an open position that the active end can move freely and a closed position that the active end locks to the frame while the elastic arm extends into the opening.

According to another aspect of the present invention, a holding device assembly mounted to an electrical connector, comprises a central package unit (CPU) and a holding device. The holding device includes a frame with an opening defined in a center thereof to receive the CPU. The frame includes a first locking portion and a second locking portion to fix the CPU commonly. A second locking portion can be detached from the frame.

Other objects, advantages and novel features of the invention will become more apparent from the following detailed description of a preferred embodiment when taken in conjunction with the accompanying drawings.

DETAILED DESCRIPTION OF THE INVENTION

Figure 1:
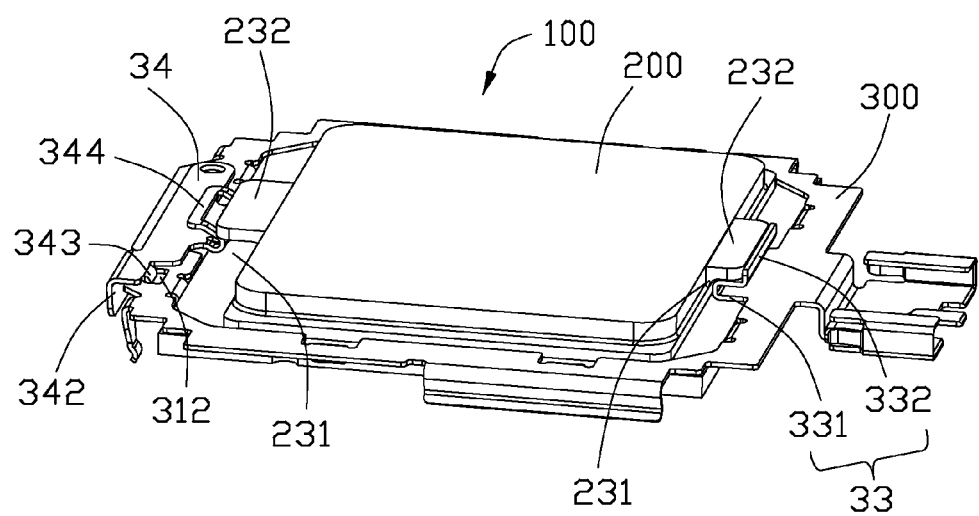
FIG. 1 is an assembled, perspective view of a holding device assembly in accordance with the present invention.
Figure 2:
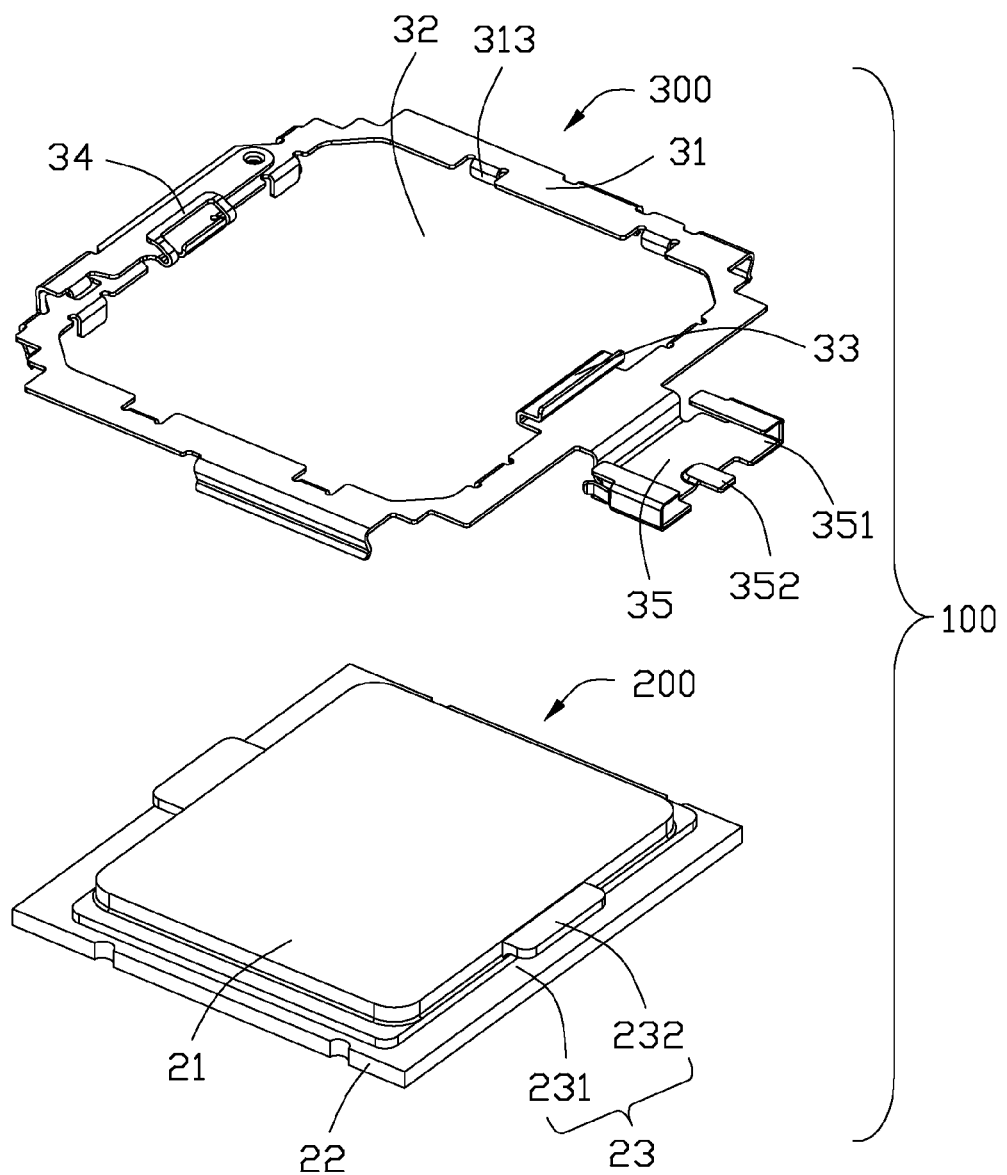
FIG. 2 is an exposed, perspective view of the holding device assembly shown in FIG. 1.
Figure 5:
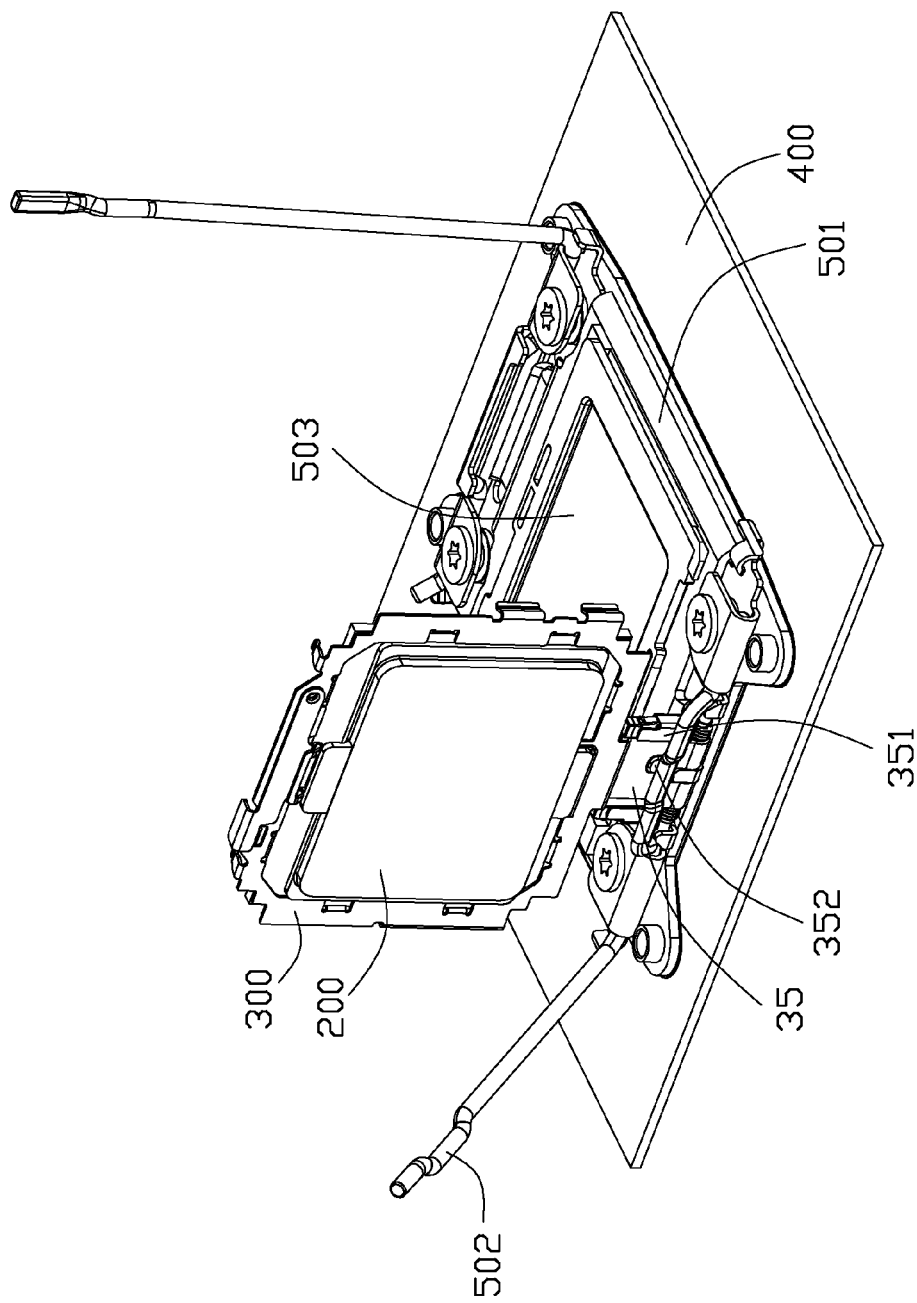

FIG. 1 and FIG. 2 shown a holding device assembly 100 includes a holding device 300 and a central package unit (CPU) 200 assembled in the holding device 300. Referring to FIG. 5, the holding device assembly 100 is assembled to an electrical connector 500 mounted on a printed circuit board 400 for establish an electrical connection between the CPU 200 and the printed circuit board 400.

Referring to FIG. 2, the CPU 200 includes a substrate 22 and a die 21 disposed on the central of the substrate 22. The substrate 22 has a pair of retention portion 23 disposed at two opposite sides thereof. Each retention portion 23 includes an ear 232 extending upwardly from the substrate 22 and a receiving room 231 formed below the ear 232.

Referring to FIG. 2, the holding device 300 includes a frame 31 and an opening 32 defined by the frame 31. The frame 31 has a plurality restrained portions 313 extending downwardly from inner edges of the frame 31 to restrain edges of the substrate 22 of the CPU 200. The frame 31 further includes a first locking portion 33 and a second locking portion 34 extending from opposite inner edges thereof. And a mounting portion 35 is disposed on an outer edge of the frame 31.

Referring to FIG. 1 and FIG. 2, the first locking portion 33 and the second locking portion 34 have different structures. The first locking portion 33 integrally extends from the frame 31. The first locking portion 33 includes a substantially U-shaped spring portion 331 adapt for received in the receiving room 231 of the CPU 200 and a bar 332 extending upwardly from the spring portion 331 adapt for abutting against a side edge of the ear 232.

Figure 3:
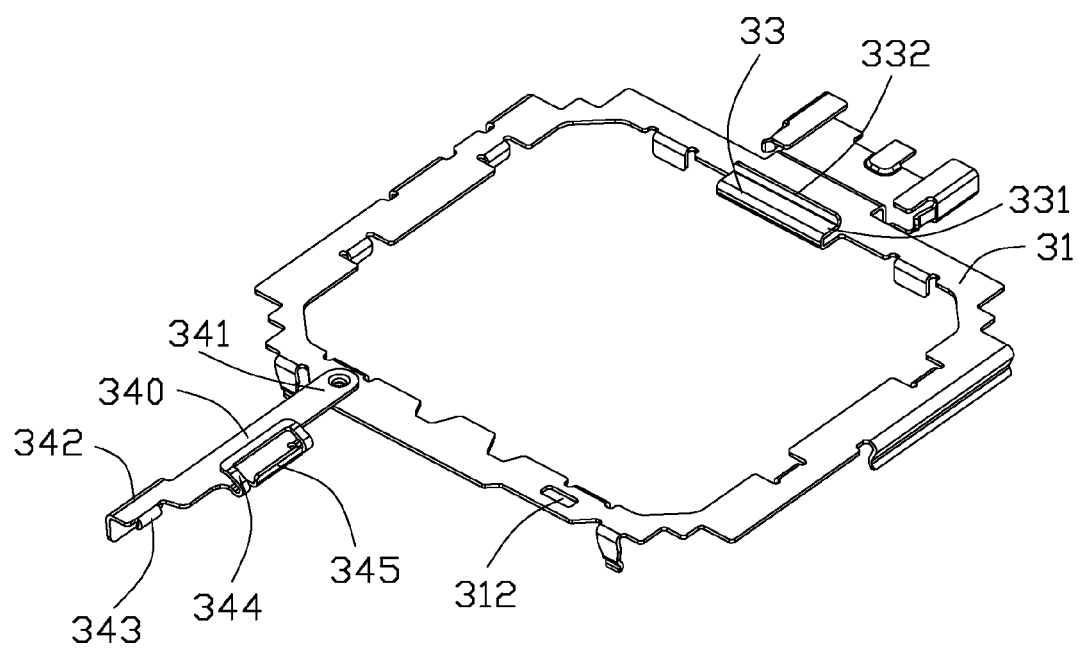
Figure 4:
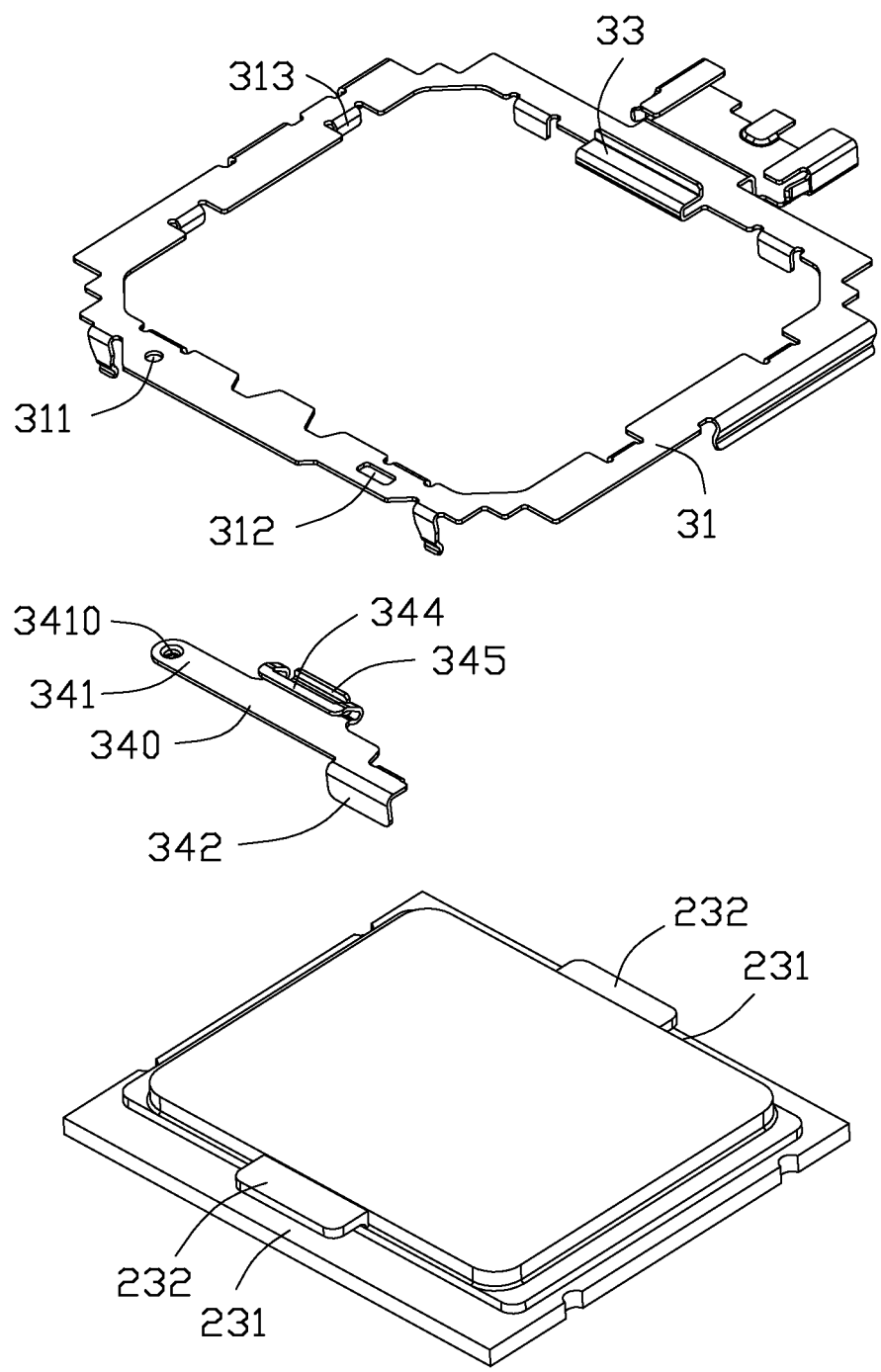

Referring to FIG. 3 and FIG. 4, the second locking portion 34 movatally mounted on the frame 31. The second locking portion 34 has a main body 340 with a fixed end 341 and an active end 342 rotating around the fix end 341. The fixed end 341 has a hinge 3410 equipped with a hole 311 of the frame 31. The active end 342 has a latch 343 adapted to lock an aperture 312 of the frame 31. The second locking portion 34 includes an elastic arm 344 like a window shape providing a resisting force to allow the latch 343 fixed reliable and a stopper 345 disposed in the elastic arm 344 to support a bottom of the ear 232. For the stopper 345, the CPU 200 can't drop from the frame 31.

FIG. 3 shows the second locking portion 34 located in an open position. On that condition, the CPU 200 can be assembled in the opening 32 from a bottom of the frame 31, the details are as follows. Firstly, the CPU 200 needs alignment with the first locking portion 33. Then the CPU 200 needs orientation with the restrained portions 313. After that, the second locking portion 34 is rotated to make the latch 343 lock to the aperture 312 to achieve a closed position.

Referring to FIG. 2 and FIG. 5, the holding device assembly 100 can rotate with regard to the electrical connector 500. In this embodiment, the holding device assembly 100 mounted to the electrical connector 500 by the mounting portion 35 of the frame 31. The mounting portion 35 includes a pair of recesses 351 and a guiding portion 352 to equip with the electrical connector 500. The electrical connector 500 includes an insulative housing (not shown), a load plate 501, a pick-up cap 503 mounted on the load plate 501, and at least one lever 502 to lock the load plate 501. In this embodiment, the holding device assembly 100 mounted to the electrical connector 500 is fixed by the load plate 501 and the lever 502.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. A holding device used for an electrical connector, comprising:
   a frame with an opening defined on a center thereof;
   a first locking portion disposed on the frame and extending into the opening;
   a second locking portion having a main body with an elastic arm, the main body defining a fixed end fixed to the frame and an active end rotating around the fixed end; and wherein
   the second locking portion has an open position that the active end can move freely and a closed position that the active end locks to the frame while the elastic arm extends into the opening.

2. The holding device as claimed in claim 1, wherein the second locking portion includes a stopper adjacent to the elastic arm.

3. The holding device as claimed in claim 2, wherein the elastic arm is formed with a window shape and the stopper is disposed in the window.

4. The holding device as claimed in claim 1, wherein the fixed end has a hinge to equip with a hole defined on the frame.

5. The holding device as claimed in claim 1, wherein the active end has a latch extending from the main body to lock with the frame.

6. The holding device as claimed in claim 1, wherein the frame includes a plurality of restrained portions extending downwardly from inner sides of the frame.

7. The holding device as claimed in claim 1, wherein the first locking portion includes a substantially U-shaped spring portion and a bar extending upwardly from the spring portion.

8. A holding device assembly mounted to an electrical connector, comprising:
   a central package unit (CPU); and
   a holding device including a frame with an opening defined in a center thereof to receive the CPU, the frame including a first locking portion and a second locking portion to fix the CPU; and wherein
   a second locking portion can be detached away from the frame; wherein
   said CPU is associatively fixed to and moved along with the holding device.

9. The holding device assembly as claimed in claim 8, wherein the CPU includes ears extending upwardly thereof to form receiving rooms at the bottom of the ears.

10. The holding device assembly as claimed in claim 9, wherein the first locking portion includes a substantially U-shaped spring portion adapt for received in the receiving room of the CPU and a bar extending upwardly from the spring portion adapt for abutting against a side edge of the ear.

11. The holding device assembly as claimed in claim 9, wherein the second locking portion has a main body defining a fixed end with a hinge fixed to the frame and an active end rotating around the hinge.

12. The holding device assembly as claimed in claim 11, wherein the main body includes an elastic arm and a stopper both extending upwardly from the main body.

13. The holding device assembly as claimed in claim 11, wherein the active end has a latch to lock with a corresponding aperture of the frame.

14. An electrical connector assembly comprising:
   an electrical connector defining a front-to-back direction;
   an electronic package mated with the connector and defining opposite first and retention sections;
   a holding device holding the electronic package for mating with the connector, and pivotally mounted around one end of said connector in said front-to-back direction, said holding device including a first locking portion which is essentially immoveable at one end of the holding device in said front-to-back direction and adapted to be engaged with the first retention section of the electronic package, and a second locking portion which is pivotally mounted to the other end of the holding device in said front-to-back direction so as to be not only in an open position to prevent a large operation force during assembling/disassembling of the electronic package to/from the holding device but also to be in a locked position to cooperate with the first locking portion to secure the electronic package in position.

15. The electrical connector assembly as claimed in claim 14, wherein the first end of the holding device is adjacent to said end of the connector while the second end of the holding device is far away from said end of the connector.

16. The electrical connector assembly as claimed in claim 15, wherein the holding device is equipped with a spring around the first end and a hook portion around the second end to resist said spring and lock the holding device in a horizontal position regard to the connector.

17. The electrical connector assembly as claimed in claim 16, further including a load plate pivotally mounted around the other end of the connector and seated upon the holding device when assembled.

18. The electrical connector assembly as claimed in claim 14, wherein the holding device is pivotal about an axis extending in a direction perpendicular to said front-to-back direction.

19. The electrical connector assembly as claimed in claim 14, wherein said second locking portion is pivotal about another axis extending in a direction perpendicular to a main plane defined by a frame structure of said holding device.

* * * * *